US008334695B2

(12) United States Patent
McColl et al.

(10) Patent No.: US 8,334,695 B2
(45) Date of Patent: Dec. 18, 2012

(54) METHOD AND APPARATUS FOR IMPROVING THE QUALITY OF MR IMAGES SENSITIZED TO MOLECULAR DIFFUSION

(75) Inventors: Roderick William McColl, Dallas, TX (US); David Embrey Purdy, Pearland, TX (US)

(73) Assignees: Siemens Medical Solutions USA, Inc., Malvern, PA (US); Board of Regents of The University of Texas System, Austin, TX (US)

( * ) Notice: Subject to any disclaimer, the term of this patent is extended or adjusted under 35 U.S.C. 154(b) by 449 days.

(21) Appl. No.: 12/731,628

(22) Filed: Mar. 25, 2010

(65) Prior Publication Data

US 2011/0234223 A1    Sep. 29, 2011

(51) Int. Cl.
*G01V 3/00* (2006.01)
(52) U.S. Cl. ........................................ 324/309; 324/307
(58) Field of Classification Search .......... 324/300–322; 600/407–445
See application file for complete search history.

(56) References Cited

U.S. PATENT DOCUMENTS

| 5,092,335 | A  | * | 3/1992 | Le Bihan ..................... 600/410 |
| 5,539,310 | A  |   | 7/1996 | Basser et al. |
| 7,239,140 | B1 |   | 7/2007 | Maier et al. |
| 7,408,345 | B2 | * | 8/2008 | Bammer et al. ............ 324/307 |
| 7,834,627 | B2 | * | 11/2010 | Sakai et al. ................. 324/318 |
| 8,111,068 | B2 | * | 2/2012 | Duerk et al. ................. 324/307 |
| 2012/0068699 | A1 | * | 3/2012 | Horkay et al. .............. 324/300 |

* cited by examiner

*Primary Examiner* — Brij Shrivastav
(74) *Attorney, Agent, or Firm* — Schiff Hardin LLP

(57) ABSTRACT

In a method and apparatus for magnetic resonance (MR) imaging of an object, and in particular MR imaging that yields images sensitive to molecular diffusion, undesired image artifacts induced by the rhythmic motion of the apparatus are reduced by manipulating the amplitude, phase, and timing of the diffusion encoding gradient pulses in a manner that interrupts, diminishes, or cancels the rhythmic motion. The residual vibration is evaluated manually or automatically to make such manipulations.

16 Claims, 7 Drawing Sheets time

METHOD AND APPARATUS FOR IMPROVING THE QUALITY OF MR IMAGES SENSITIZED TO MOLECULAR DIFFUSION

BACKGROUND OF THE INVENTION

1. Field of the Invention

The present invention relates to magnetic resonance (MR) imaging, and more particularly relates to a method and apparatus useful for improving the quality of high resolution MR images that are sensitized to molecular diffusion.

2. Description of the Prior Art

It is well known that magnetic resonance images can be degraded by motion during the imaging scan. Bulk motion of the object to be imaged is a particular problem for MR imaging methods that are designed to detect small diffusional motions of molecules within the object. These "diffusion-weighted" images are of interest, for example, for the detection of brain lesions associated with stroke. The MR apparatus ("imager") allows diffusion sensitization in various spatial directions, and further analysis of images made sensitive in different spatial directions yields "diffusion tensor" images or maps, which provide information about the location and direction of nerve tracts (Basser et al., U.S. Pat. No. 5,539,310). A variety of pads and clamps are used to reduce patient motion during such examinations. The effects of motion are further reduced by employing rapid "single-shot" MR methods that acquire a complete image in approximately one-tenth of a second, such as Echo Planar Imaging ("EPI"), "spiral imaging" or "projection reconstruction" ("PR"). The invention will be described using the EPI method, with the understanding that spiral, PR, or other rapid methods may be employed in an analogous fashion. In spite of these efforts to minimize bulk motion, diffusion-sensitive images are often marred by significant artifactual signal loss in portions of the field of view, and some of this signal loss is associated with mechanical vibration of the patient (Maier et al., U.S. Pat. No. 7,239,140). Magnetic resonance imagers apply time-dependent pulses of electrical current to magnetic field gradient coils during the usual scanning process. Because these current pulses occur within the static magnetic field of the apparatus, they create unwanted mechanical vibrations that are transmitted to various components of the apparatus. In particular, these vibrations may be transmitted to the patient table, and cause vibration of the patient.

In general, the large and heavy MR apparatus does not attain a stable vibration pattern instantaneously, or even during the time required for one or a small number of EPI scans. Thus, it is possible to obtain one or a small number of images free of vibrational artifacts, provided that the apparatus is vibration-free at the start of the measurement period.

The complex vibrational motions of the MR apparatus are not determined solely by the physical characteristics of said apparatus. Said motions are strongly influenced by the strength, duration, and timing of the electrical pulses (the "gradient pulses") applied to the magnetic field gradient coils (the "gradient coils"), and by which of the (typically three) gradient coils is energized or are simultaneously energized. Thus, the characteristics of the MR "pulse sequence" used to obtain the MR image strongly affect the mechanical vibration. MR pulse sequences designed to detect molecular diffusion are especially sensitive to mechanical vibration of the patient for two reasons. First, said sequences incorporate gradient pulses that deliberately sensitize the resulting images to motion, macroscopic or microscopic. Second, said gradient pulses are deliberately of high amplitude to make the resulting images as sensitive as possible to motion. The high current amplitude gives rise to a high gradient field and a strong mechanical force (a jolt) that may cause vibration of the apparatus. Thus, diffusion sensitive pulse sequences can both create unwanted vibration and can be very sensitive to the effects of said vibration.

For the purpose of this description, it is useful to distinguish radiofrequency (RF) "excitation" pulses from "echo-forming" RF pulses. By convention, the equilibrium magnetization, which aligns parallel to the main magnetic field, is said to point in the +z direction. The purpose of an RF excitation pulse is to nutate magnetization from the z ("longitudinal") direction fully or partially into the x-y ("transverse") plane, where it precesses and gives rise to a detectable signal. To obtain the strongest signal, the RF excitation pulse can nutate the z magnetization by 90°, but other nutation angles are also used. In contrast, the purpose of an echo-forming RF pulse is to flip the x-y magnetization, that is, to rotate the x-y magnetization, usually by 180°, about some axis which lies in the x-y plane and passes through the origin. This gives rise to the spin echo, which is generally useful in the construction of pulse sequences. FIG. 1 illustrates a single-shot pulse sequence that acquires all of the data required to reconstruct at least one image following the application of a single RF excitation pulse 40. The five traces show the temporal relationships among the RF and gradient events, plotting relative amplitudes against time. The slice selection, readout, and phase-encoding gradients are applied along mutually orthogonal axes, for example the X, Y, and Z axes of the apparatus, while the diffusion-encoding gradient may be applied along any desired axis. Data are acquired during the oscillations of the readout gradient, only a few of which are shown. Spin echo data acquisition schemes require one (e.g., 52 in FIG. 2) or more echo-forming RF pulses, but these do not rotate additional magnetization from the z axis into the x-y plane, and do not change the single-shot nature of the pulse sequence. In contrast, multi-shot pulse sequences require two or more RF excitation pulses to acquire all the data require to reconstruct an image, and, to avoid image artifacts, precautions must be taken to ensure the consistency of the several partial data sets needed to reconstruct an image.

To acquire the data needed to reconstruct the image of a single slice, typical diffusion sensitive sequences sequentially apply two or more high amplitude gradient pulses (a "multiplet") to sensitize ("encode") the resulting images to diffusional motion in one particular spatial direction. Although many encoding schemes are possible, the effect of these pulses will be illustrated in a non-limiting manner by their simplest forms. The ordinary slice-selective RF excitation pulse 40 of the single-shot EPI pulse sequence is followed by a first diffusion-encoding gradient pulse of positive amplitude (41 in FIG. 1), and thereafter by a second diffusion-encoding gradient pulse of equivalent duration, but negative amplitude (43). Said first diffusion-encoding pulse changes the phases of ("dephases") the nuclear magnets ("spins") along one spatial direction. For stationary spins, said second diffusion-encoding pulse, which has the same spatial orientation as the first diffusion-encoding gradient pulse, but the opposite polarity, reverses ("rephases") the phase changes induced by the first diffusion-encoding gradient pulse. More generally, the rephasing of stationary spins occurs when the integral over both pulses is zero. Spins that have moved by diffusion or bulk motion in the selected direction during the time between the two pulses remain somewhat dephased, and the MR signal from these spins is reduced. This sensitivity to diffusion is enhanced by the use of stronger or longer diffusion-encoding gradient pulses, or by increasing the time between the dephasing and the rephasing gradient pulses. The diffusion-encoding period is followed by an EPI readout and phase encoding scheme of ordinary design (44) that acquires, for single-shot scans, all the data needed to form one two-dimensional image at one slice position in approximately 0.1 second. EPI is often performed using an echo-forming RF pulse to form a spin echo. In this case, it is efficient to apply the first diffusion-encoding gradient pulse 51 before the echo-forming RF pulse 52, and to place the second diffusion-encoding gradient pulse 53 after said RF pulse (E. O. Stejskal, and J. E. Tanner, J. Chem. Phys. 42 (1965) 288). The echo-forming RF pulse reverses the sense of the dephasing created by the first diffusion-encoding gradient, so the second diffusion-encoding gradient pulse is applied with the same polarity as the first diffusion-encoding gradient pulse, and both pulses have the same integral.

For example, to sensitize the resulting image to motion in the X spatial direction, said diffusion-encoding pulses are applied to the conventional X gradient coil. To sensitize the image to motion in a direction that is not aligned with the usual X, Y, or Z axes, simultaneous current pulses with appropriate amplitudes are applied to an appropriate combination of two or three of the conventional X, Y, and Z gradient coils. These diffusion-encoding gradient pulses are typically the strongest, or are among the strongest, gradient pulses of the pulse sequence, and will make a significant contribution to any vibration of the apparatus. To determine the spatial orientation of the diffusional motion, it is common practice to acquire additional images at the same slice position utilizing diffusion-encoding gradient pulses that sensitize said images to motion in additional distinct spatial directions. Since the spatial orientation of the gradients used for diffusion sensitization of said images is unrelated to the gradient directions used for ordinary slice selection, readout, and phase encoding, a plurality of images at the same slice position, but having different orientations of diffusion sensitization, may be acquired in separate single-shot scans, altering only the diffusion-encoding gradients. To detect and quantify the diffusion-induced reduction in signal intensity, it is common to acquire as reference an additional image at said slice position in the absence of the diffusion-encoding pulses. To obtain additional information about the diffusion process, it is also common to acquire additional images at said slice position with diffusion encoding along said distinct spatial directions, but having different sensitivities to the diffusion process (the so-called "b values"). For example, the diffusion sensitivity of the pulse sequence in FIG. 1 may be altered by changing the magnitude of gradient pulses 41 and 43 in multiplet 45 by the same factor, or by changing their durations appropriately. Each of the changes to the diffusion-encoding pulses described above is intended to produce a different image that reveals additional distinct information about the diffusing nuclear spins, and the altered diffusion parameters will be termed "distinct diffusion-encoding orientation and sensitivity combinations," to distinguish said changes from alterations in the diffusion-encoding pulses, described below, that are deliberately designed to provide a plurality of distinct gradient pulse multiplets that maintain the same diffusion-encoding orientation and sensitivity, creating a plurality of pulse sequences that yield essentially equivalent images. These altered but equivalent pulse shapes will be termed "equivalent diffusion-encoding gradient pulse multiplets." Having specified the desired distinct diffusion-encoding orientation and sensitivity combinations, it is clinically advantageous to acquire images at a plurality of different slice positions with each said encoding, as well as unencoded reference images at each of these slice positions. A typical diffusion-sensitized acquisition may thus generate images at a plurality of parallel slice positions, images at each of said slice positions being acquired with a plurality of diffusion-encoding directions (orientations), with a plurality of diffusion-encoding sensitivities for each of said directions, and a reference image without diffusion encoding for each slice position. Because changing the spatial direction of the diffusion-encoding is accomplished by changing the currents in two or more of the typical X, Y, and Z gradient coils, it is expected that the apparatus will experience mechanical jolts with different characteristics for each distinct diffusion-encoding orientation. It is clear that changing the diffusion sensitivity by changing the amplitude of diffusion-encoding gradient pulses will increase or decrease the associated mechanical jolts. In contrast, it is the usual practice to change from one slice position to a different parallel slice position by changing the frequency of the RF pulse or pulses, which does not alter the mechanical forces experienced by the apparatus.

Because the RF pulses that excite the nuclear spins in a specified slice of tissue have essentially no effect on the nuclear spins of a second, parallel, non-overlapping slice, "single shot" methods such as EPI can acquire a plurality of non-overlapping slices very rapidly, one right after another. However, for many medical applications, including diffusion-sensitized imaging, it is not advantageous to acquire multiple images at a single particular slice position in rapid succession, because the slice-selective RF excitation pulse (40 or 50) transiently reduces the z magnetization within the slice, diminishing the z magnetization available for the next RF excitation pulse, and thus, in succeeding images, reducing the x-y magnetization that gives rise to detectable signal. It is advantageous to allow a consistent waiting period for the nuclear spins within a particular slice of tissue to relax partially or fully back to their equilibrium magnetization before disturbing said spins with another RF excitation pulse. For single-shot imaging, all of the data for one image are acquired following a single RF excitation pulse, so failure to maintain a consistent time (TR) between the RF excitation pulses that acquire separate images at one particular slice position does not result in significant image artifacts (e.g., ghosts), but rather in undesirable variations in brightness and contrast from image to image. Such brightness differences make it difficult to evaluate the effects of diffusion. It is efficient to image a plurality of other essentially non-overlapping slice positions while waiting for the magnetization of the spins at the first slice position to relax. These considerations lead to the usual, orderly sequence of events in a single-shot diffusion-sensitive pulse sequence: all of the data are acquired for one image at a first particular slice position utilizing a first particular "distinct diffusion-encoding orientation and sensitivity combination" [vide supra], then all of the data are acquired for a second particular, non-overlapping slice position with said first particular distinct diffusion-encoding orientation and sensitivity combination, this process being repeated until data have been acquired from all desired slice positions. Thereafter, data are acquired again from the first particular slice position utilizing a second particular distinct diffusion-encoding orientation and sensitivity combination, this combination having a spatial orientation or diffusion sensitivity that differs from said first particular distinct combination. Data are then collected from the remaining slice positions in the same slice order utilizing said second particular distinct diffusion-encoding orientation and sensitivity combination. Following this pattern, data are collected for each slice position using each of the desired diffusion-encoding sensitivities or directions. In the simplest implementation of this pulse sequence, no changes are made to the timing of the diffusion-encoding pulses: the diffusion sensitivity is adjusted by gradient amplitude changes, and the orientation of the encoding is changed by a redistribution of the currents in the X, Y, and Z gradient coils without altering the vector sum gradient strength. The regular, repetitive acquisition of a "block" of distinct slice positions in a fixed spatial-temporal order ensures the desired, constant TR for all of the images, as long as the conventional pre-scans have been performed to establish a steady state of the magnetization. An advantage of this data collection scheme is that its nested, repetitive structure is easily programmed using the looping statements available in all computer languages. An example of such a scheme is shown in FIG. 3 for five distinct parallel slices at positions S1-S5, four diffusion-encoding directions D1-D4, two non-zero diffusion-encoding sensitivities (amplitudes) A1-A2, and a set of five unencoded (zero diffusion-encoding amplitude, denoted A0) slices. Each of the 45 boxes, numbered in temporal order, represents one complete single-shot image acquired with a unique combination of parameters. The time between each acquisition is constant. Each block of five slices is encoded with the same diffusion weighting, for example D1-A1 for images #01 to #05, resulting in a completely repetitive gradient pulse pattern. In this example, the unencoded slices are acquired last (image #41 to image #45). The mechanical jolting of the MR apparatus occurs as each image is acquired, typically about every 0.1 second. This period will be called the Mechanical Repetition Time or MRT to distinguish it from TR, the time between the acquisition of a single-shot image at a particular slice position and the next acquisition at the same slice position. For example, if the images in FIG. 3 are acquired, one after another, every 0.1 second, then slice S1 is acquired with a new combination of diffusion-encoding orientation and sensitivity every 0.5 second. The MRT is 0.1 second, and the TR is 0.5 second.

The mechanical jolting of the MR apparatus is a highly regular process. It is the usual practice that the single-shot acquisitions required for a plurality of slices be distributed evenly in time over the selected TR period, resulting in a steady beat of the diffusion-sensitizing gradient pulses, and a constant value of the MRT. Furthermore, the gradient pulses used to select one particular slice position do not differ from the gradient pulses used to select other parallel slice positions, so the mechanical jolts applied to the MR apparatus for each of the example five slices will be the same for the first particular distinct diffusion-encoding orientation and sensitivity combination (images #01 to #05). When this same five-slice block is again imaged with the second particular distinct diffusion-encoding orientation and sensitivity combination (images #06 to #10), the resulting mechanical jolts will have a different amplitude or direction from the jolts resulting from the first particular distinct diffusion-encoding orientation and sensitivity combination, but will maintain the same MRT.

The vibration induced in the patient is a function of the mechanical design of the MR apparatus and the amplitude, timing, and phase of the mechanical jolts created by energizing the gradient coils. The operator of the MR imager has some control over said amplitude and timing. For example, the operator may increase the TR, and thus for common sequences the MRT, to avoid an MRT period that creates a strong mechanical resonance within the MR imager and substantial image artifacts. In practice, however, there is no value of the MRT which completely eliminates mechanical vibration. Existing MR pulse sequences that acquire data in the order described by the example above usually have a sufficient number of slices, and thus a sufficient number of identical and equally-spaced mechanical jolts, to establish an undesired steady state of rhythmic motion in the patient table of the MR imager, and thus in the patient.

For multi-shot diffusion-weighted imaging, an RF excitation pulse is followed by diffusion-encoding gradient pulses, and then the collection of only part of the data required to reconstruct an image. This partial data acquisition (shot) must be repeated several times to acquire all of the data needed for an image, and the diffusion encoding must be effectively the same for each shot. Thus, when standard pulsing schemes are applied to multi-shot, multi-slice diffusion-weighted imaging, long trains of identical diffusion-encoding pulse multiplets may result. Maier et al. (U.S. Pat. No. 7,239,140) recognized that it is possible to create a plurality of diffusion-encoding gradient pulse multiplets of the same spatial orientation and diffusion sensitivity, but different mechanical properties. For example, the gradient amplitudes of pulses 51 and 53 of multiplet 55 in FIG. 2 can be negated, reversing the current flow in the associated gradient coil or coils. This reversal of polarity does not alter the spatial orientation of the diffusion encoding or the diffusion sensitivity (b value), but one may expect that the mechanical properties of the jolt resulting from such a modified pulse will differ from that of the original multiplet 55. Other possible modifications include, for example, increasing the gradient pulse duration while decreasing the amplitude, or using four encoding pulses per multiplet instead of the two shown in FIG. 2, all while maintaining the same encoding orientation and sensitivity. These modifications create pulses that are "equivalent diffusion-encoding gradient pulse multiplets" with respect to randomly diffusing spins, but not equivalent with respect to the vibrations they induce. In the absence of net motion along the encoding direction, and gradient imperfections such as eddy currents, these equivalent multiplets may be used as substitutes for some of the original multiplets without affecting the final images. The desired diffusion-weighted pulse sequence may then be played out in the usual order of slice positions and diffusion encoding orientations and sensitivities, substituting equivalent diffusion-encoding gradient pulse multiplets for an optimized or random subset of the original diffusion-encoding gradient pulse multiplets, thus altering the vibrational character of the sequence. This partial substitution may be optimized by computer simulation and monitored by a vibration sensor 32 attached to the patient table. The method is applicable to single-shot imaging. FIG. 4 shows an example of such a partial multiplet substitution applied to the same order of slices, encoding orientations and encoding sensitivities used for the single-shot example of FIG. 3. A plus sign in front of the diffusion direction indicates the same pulse multiplet used in FIG. 3, while a minus sign indicates a reversal of the gradient currents, that is, a negation of the amplitude of each gradient pulse used to create the diffusion-encoding multiplets like 45 in FIG. 1. The fully repetitive pattern of gradient pulses seen, for example, from image #01 to image #05 in FIG. 3, is broken up by irregular diffusion-encoding gradient reversals in FIG. 4. In the absence of bulk motion or gradient eddy current effects, the 45 images that result from the encoding gradients in FIG. 4 should be equivalent to those obtained from the repetitive pulse sequence in FIG. 3. The MRT has not changed, but the nature (e.g., direction) of some of the mechanical jolts will have changed, thus altering the vibrational characteristics of the apparatus.

SUMMARY OF THE INVENTION

A method and apparatus for diffusion-sensitive magnetic resonance (MR) imaging of a living patient, wherein undesired image artifacts induced by the rhythmic motion of the patient table are reduced by advantageously manipulating the order of the diffusion-encoding gradient pulses and the timing of slice acquisitions in a manner that interrupts, diminishes, or cancels said rhythmic motion. In contrast to existing pulse sequences that begin by acquiring one image at each of a plurality of different parallel slice positions, one after another, with diffusion-encoding gradient pulses having a first fixed combination of one diffusion-encoding orientation and one sensitivity and repetitive timing, a first aspect of the invention acquires one image at each of a plurality of different slice positions, one after another, utilizing a first varying combination of diffusion-encoding orientations and sensitivities that is chosen to avoid a rhythmic pattern of the gradient pulses in the X, Y, and Z gradient coils. After acquiring one image at each of the desired slice positions in the slice block, the slices are reacquired repeatedly in the same positional order using additional distinct varying combinations of diffusion-encoding orientations and sensitivities, until one image has been acquired with each desired, unique combination of the slice position, the diffusion-encoding orientation, and the diffusion-encoding sensitivity, that is, for each "encoding/slice combination." This slice by slice and block by block scrambling (reordering) of the orientations and sensitivities advantageously includes the reference images, one for each desired slice position, which are thus scattered among the diffusion-sensitized acquisitions. An irregular pattern of these reference images, which lack high amplitude diffusion-encoding gradient pulses, is helpful for disrupting regular patterns of mechanical jolts. Thus, the invention reduces vibration by a random or optimized reordering of a minimal set of diffusion-encoding gradient pulse multiplets having the desired combinations of diffusion-encoding orientations and sensitivities, compared to existing methods which modify a first set of encoding pulse multiplets to create a set of equivalent diffusion-encoding gradient pulse multiplets having the same diffusion-encoding orientation and sensitivity as said first set, and then apply a pattern of unmodified and the modified pulse multiplets to different slices as in the example of FIG. 4. The invention provides a straightforward method of decreasing the repetitive nature of succeeding diffusion-encoding pulse multiplets without changing the duration, amplitude or multiplicity of the pulse multiplet associated with a given diffusion-encoding orientation and sensitivity.

Since the invention does not adhere to a repeated pattern (a "nested loop structure") of diffusion-encoding orientations and sensitivities, additional images with any desired diffusion encoding, or with no encoding, may be acquired without restriction to such a structure. In a second aspect of the invention, additional unencoded images, beyond the one reference image commonly acquired at each distinct slice position, are scattered throughout the entirety of the scan to further interrupt the rhythmic pattern of mechanical jolts.

A third aspect of the invention uses irregular timing between the slices within a slice block to suppress regular jolting of the apparatus and thus vibration. Because each slice position will eventually be acquired with a plurality of distinct combinations of diffusion-encoding orientation and sensitivity, it is necessary to maintain a constant repetition time for the spins at each slice position, so the slice position order and the irregular timing within the slice block remain unchanged as the block is repeatedly imaged with different varying combinations of diffusion-encoding orientations and sensitivities.

Either the first aspect of the invention or the third aspect of the invention may be used independently to reduce undesired vibration, or both aspects of the invention may be used simultaneously and advantageously to reduce the vibration further. If the first aspect of the invention is utilized, then the second aspect of the invention may be employed to reduce vibration further. Because the optimal reordering pattern of the diffusion-encoding gradients and the optimal alteration of the slice-to-slice timing will change from patient to patient, the invention provides the operator with means to adjust said pattern and said timing. To guide manual changes of this adjustment or to permit automatic adjustment, the invention optionally provides means to measure and quantify the vibration of the patient table using known methods.

DESCRIPTION OF THE PREFERRED EMBODIMENTS

Figure 5:
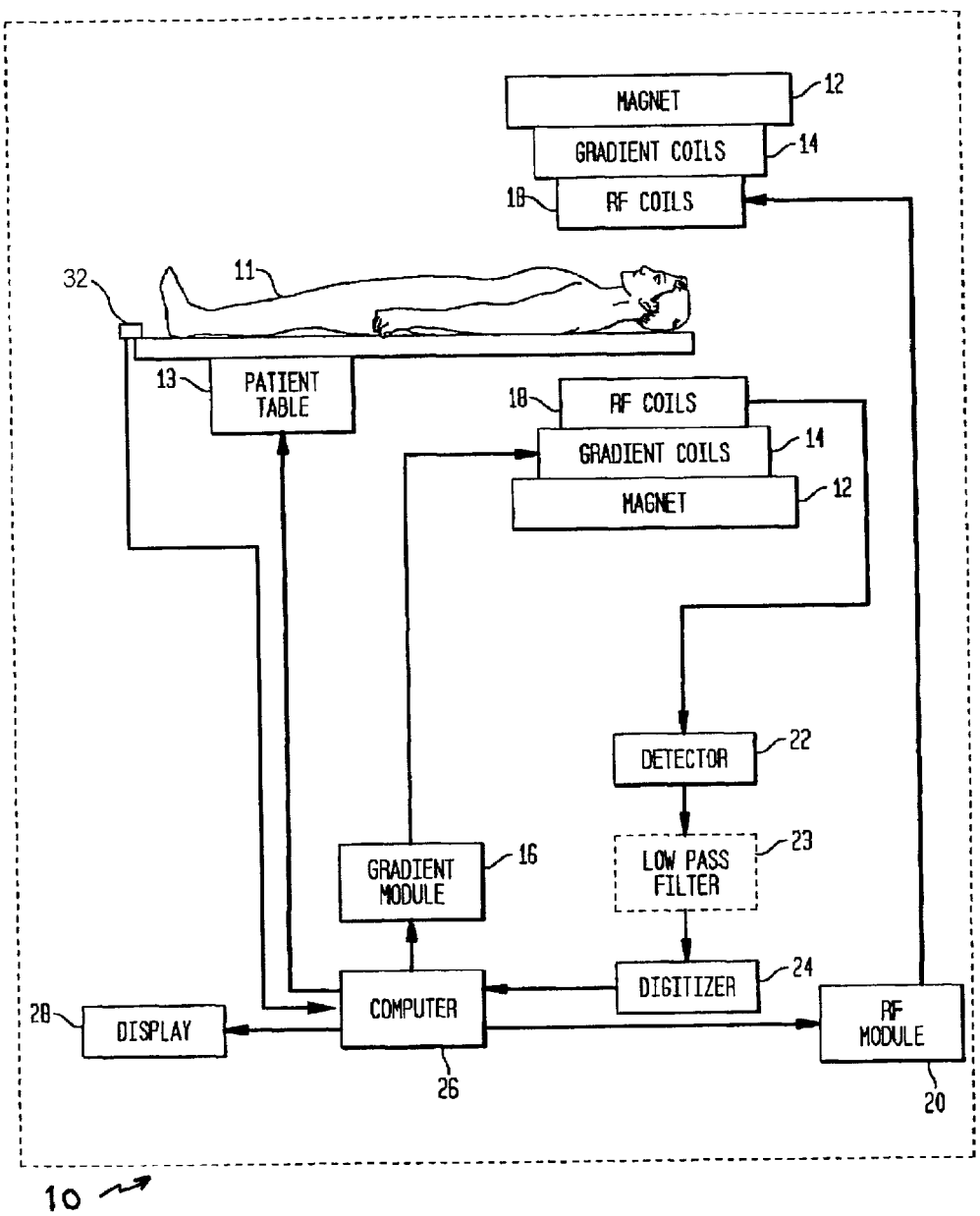
FIG. 5 illustrates an MR imaging system useful for carrying out the method and apparatus of the invention.

FIG. 5 shows a block diagram illustrating the operation of an MR imaging system 10 which may be used in connection with the method and apparatus of the invention. Since such imagers are well known, what follows is only a brief overview description of such a device. In the interest of brevity and clarity, throughout the remaining description only specific changes from known and conventional parameters are provided, in order to give the reader a complete understanding of the invention without undue complexity.

A magnet 12 is provided for creating a static/base magnetic field in a body 11 positioned on a table 13 to be imaged. Within the magnet system are gradient coils 14 for producing position dependent magnetic field gradients superimposed on the static magnetic field. Gradient coils 14, in response to gradient signals supplied thereto by a gradient module 16, produce the position-dependent magnetic field gradients in three orthogonal directions. Within the gradient coils is an RF coil 18. An RF module 20 provides RF pulse signals to the RF coil 18, which in response produces magnetic field pulses which rotate the spins of the protons in the imaged body 11 by ninety degrees or by one hundred and eighty degrees or by a different angle useful for the particular imaging technique. In response to the applied RF pulse signals, the RF coil 18 receives MR signals, i.e., signals from the excited protons within the body as they return to an equilibrium position established by the static and gradient magnetic fields, which MR signals are detected by a detector 22 (comprising a preamplifier and amplifier). The MR signals are then filtered by an analog low-pass filter 23, converted into digital signals by a digitizer 24 and applied to the MR systems computer 26. Alternatively, the function of analog low-pass filter 23 may be carried out by subjecting the digital signals supplied from digitizer 24 to digital filtration algorithms in computer 26. In a manner well known to those of ordinary skill in this technology, the gradient magnetic fields are utilized in combination with the RF pulses to encode spatial information into the MR signals emanating from a plurality of slices of the body being imaged. A computer 26, knowing the details of the applied gradient magnetic fields, processes the detected MR signals so as to generate images of a selected slab (or slabs) of the body, which are then shown on a display 28. In one embodiment of the invention, a sensor 32, of ordinary design, but selected to be insensitive to the static and time-varying magnetic fields of the MR apparatus, measures the vibration of the patient table, and supplies a signal to the computer 26 to evaluate the efficacy of the invention for reducing the vibration of the table. In the presence of the main magnetic field supplied by the magnet 12, the current pulses supplied by the gradient module 16 to the X, Y, and Z gradient coils 14 create periodic mechanical jolts to said coils, and these vibrations are transmitted via various components of the system to the patient table 13 and thence to the patient 11. Although it is difficult to predict the vibrational motion of the patient table, it is clear that higher amplitude current pulses in the gradient coils will give rise to stronger jolts, and that the mechanical characteristics of these jolts will differ for the X, Y, and Z coils, which have different winding geometries.

Figure 1:
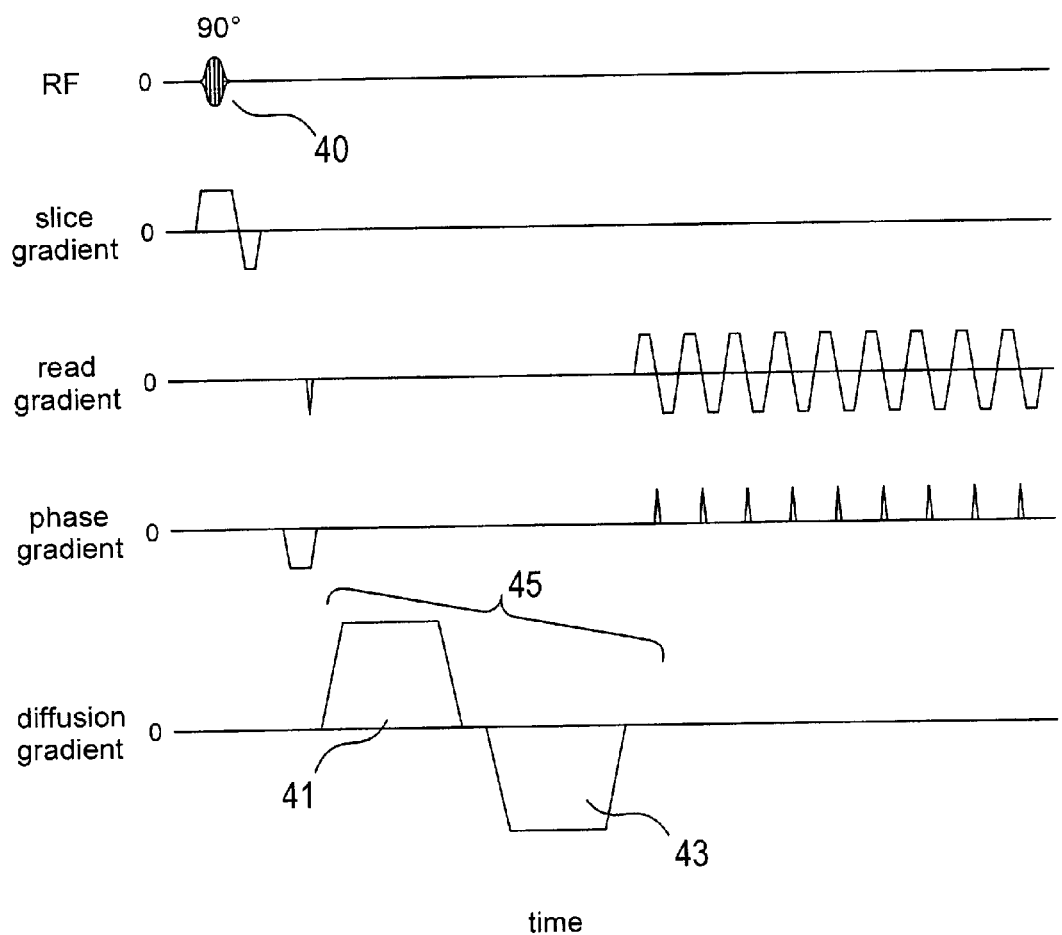
FIG. 1 illustrates the time course of the initial portion of a gradient-echo diffusion-weighted echo planar MR pulse sequence of known design.
Figure 2:
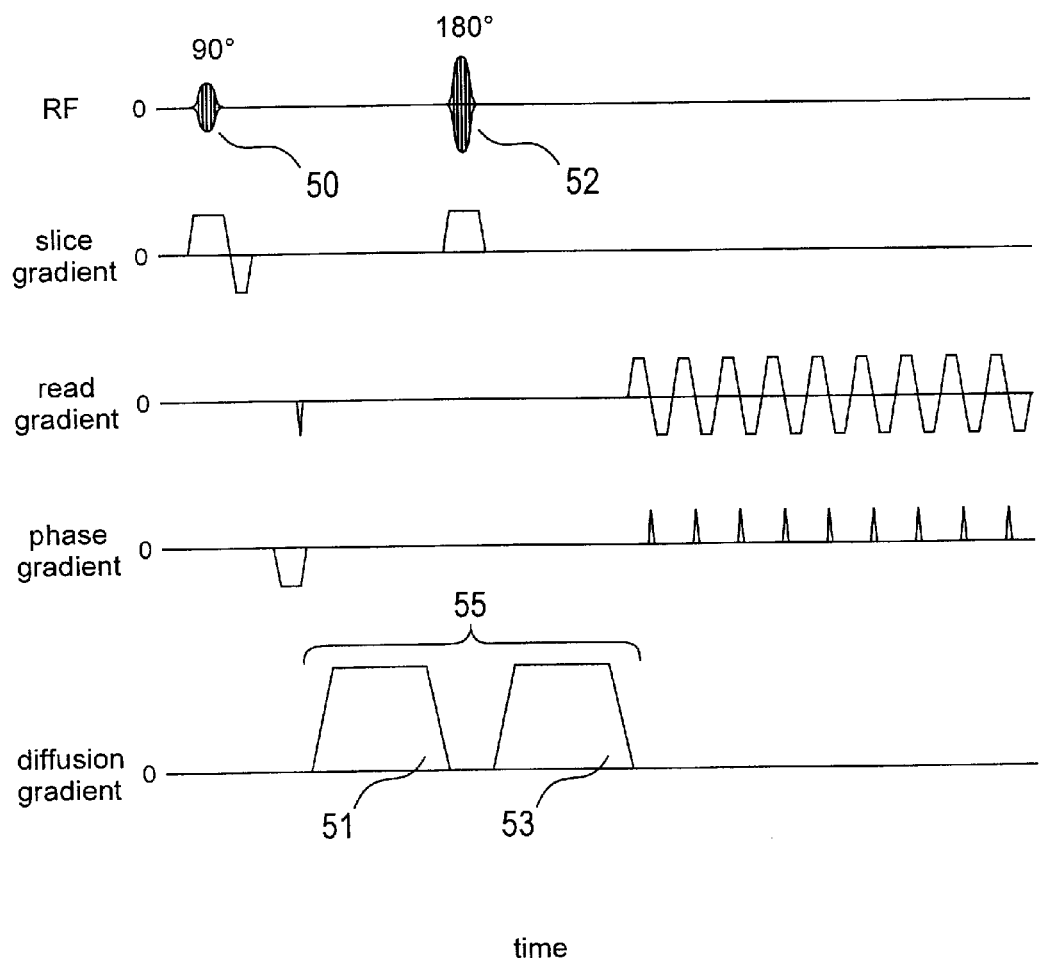
FIG. 2 illustrates the initial portion of a spin-echo diffusion-weighted echo planar MR pulse sequence of known design wherein all data required for one image are acquired after the application of two RF pulses.
Figure 3:
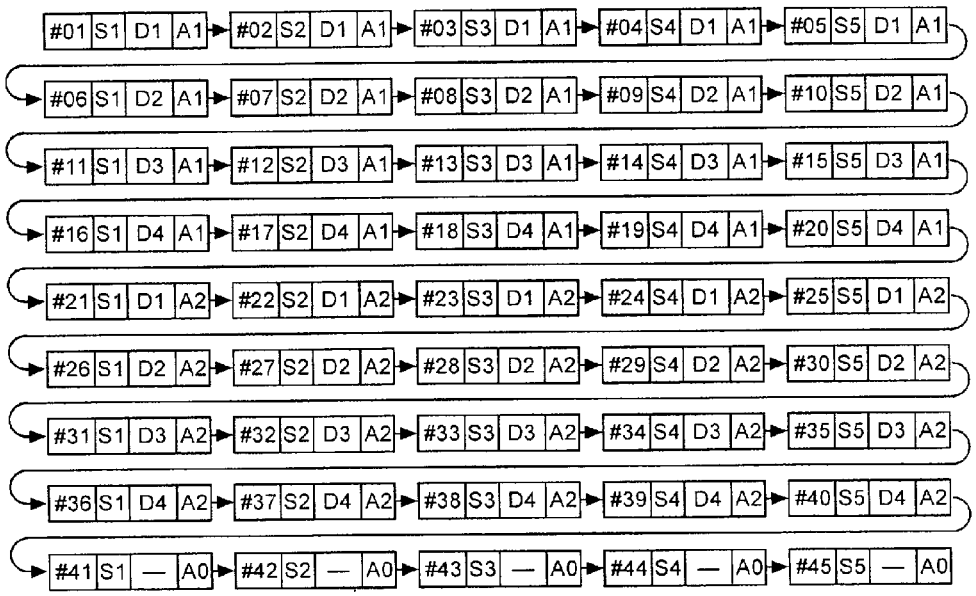
FIG. 3 shows an example of the temporal sequence of diffusion-encoding events for an acquisition of ordinary design.
Figure 4:
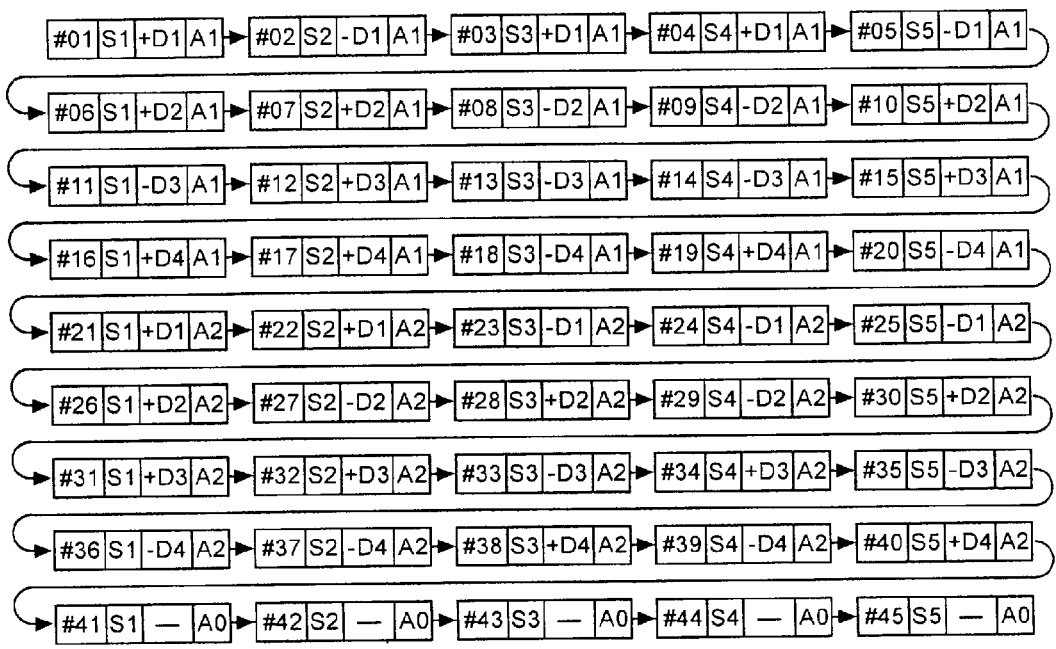
FIG. 4 shows an example of the temporal sequence of diffusion-encoding events for an acquisition following a pattern described in U.S. Pat. No. 7,239,140.

Comparison of repetitive images obtained with and without high amplitude diffusion-encoding gradient pulses shows that these pulses are responsible for significant image artifacts. Although changes in the multiplet structure of these pulses, such as between multiplet 45 and multiplet 55, will clearly alter the mechanical characteristics of the jolts produced by the pulses, no fixed choice of multiplet design will eliminate vibration of the apparatus. Fortunately, one or a small number of artifact-free single-shot diffusion-weighted images may be acquired before vibrational image artifacts are observed; it is the regular repetition of identical jolts that establishes artifact-inducing vibration of the patient, rather than the effect of a single jolt or a small number of jolts. The purpose of the invention is to make irregular changes to the characteristics of the jolts or to disturb the regular rhythm of these jolts, or both, thus preventing the establishment of a rhythmic pattern of vibrations in the patient. For a single-shot diffusion-weighted acquisition of ordinary design, images are obtained at NS distinct slice positions $S_1$ through $S_{NS}$, ND distinct diffusion-encoding orientations $D_1$ through $D_{ND}$, and NA distinct diffusion-encoding sensitivities $A_1$ through $A_{NA}$. The example of FIG. 3 shows the temporal order of the S, D, and A values for a sequence of said ordinary design where NS=5, ND=4, and NA=2, listing the values associated with each image in a separate numbered box. Additionally, an unencoded reference image (A0) is acquired at each of the five slice positions. The number of distinct diffusion-encoding orientation and sensitivity combinations ("NC") is therefore ND×NA+1, and each of the NC combinations is used for an image at each of the NS slice positions. Thus the total number of encoding/slice combinations ("NES") is NS×ND× NA+NS. In the example of FIG. 3, a total of 5×4×2+5=45 images are acquired during the complete scan. Each slice within each block of NS slices, for example each row in FIG. 3, is acquired with the same values of D and A, that is, with exactly the same diffusion-encoding pulse multiplet. Since the time between slices is ordinarily held constant, and the slice positions are selected by the ordinary method of shifting the frequency of the slice-selective RF excitation pulse, rather than by changing gradient amplitudes, the exact same pattern of gradient pulses is repeated NS times, a condition likely to create vibration of the patient, especially for large values of NS.

In the looping structure of FIG. 3, five slices are acquired with four different direction values using amplitude A1, and then the five slices are acquired again with four different direction values using amplitude A2. An alternative ordinary looping structure would acquire five slices with two different amplitude values using direction D1, and then these ten acquisitions are repeated with D2, and then D3 and then D4. This alternative looping pattern has the same disadvantages as that shown in FIG. 3, and will not be illustrated.

For single-shot imaging, there is, however, no compelling reason to acquire all of the desired slices within one slice block with only a single combination of diffusion-encoding orientation and sensitivity, for example the combination D1-A1 in the first row of FIG. 3. The first aspect of the invention recognizes that, subject to certain conditions, each of the NS slices in a given slice block may be diffusion-encoded with any of the NC distinct combinations of diffusion-encoding orientation and sensitivity. It further recognizes that an irregular temporal order of said combinations can be used to suppress vibration. In the first step of the method, an "Initial List" is prepared of the NES desired encoding/slice combinations. This Initial List ordinarily contains NS×ND×NA+NS elements, but may exclude certain unneeded combinations or include duplicates of certain combinations for which multiple images are desired. Then, NS elements are picked from the list, one associated with each of the slice positions S1, S2, S3, ... $S_{NS}$ in the first slice block, and these combinations are placed in the desired slice order at the beginning of a temporally "Reordered List," forming the first slice block. These combinations of D and A are selected to avoid a repeating pattern, to avoid a pattern known to cause unacceptable vibration, or to use a pattern known to suppress vibration. Then, a second set of NS elements is picked from the unused combinations of S, D, and A in the Initial List, one associated with each of the $S_{NS}$ slice positions, and these combinations are placed in the second slice block of the Reordered List in the same slice order as within the first slice block. Thereafter, additional combinations of S, D, and A are picked from the unused combinations in the Initial List and are transferred to the Reordered List, until the Reordered List contains all NES combinations. The order of the D and A values are selected as described above to avoid vibration, while the values of S have a fixed repeating order to maintain the same slice ordering within each block of NS slices in the Reordered List.

Figure 6:
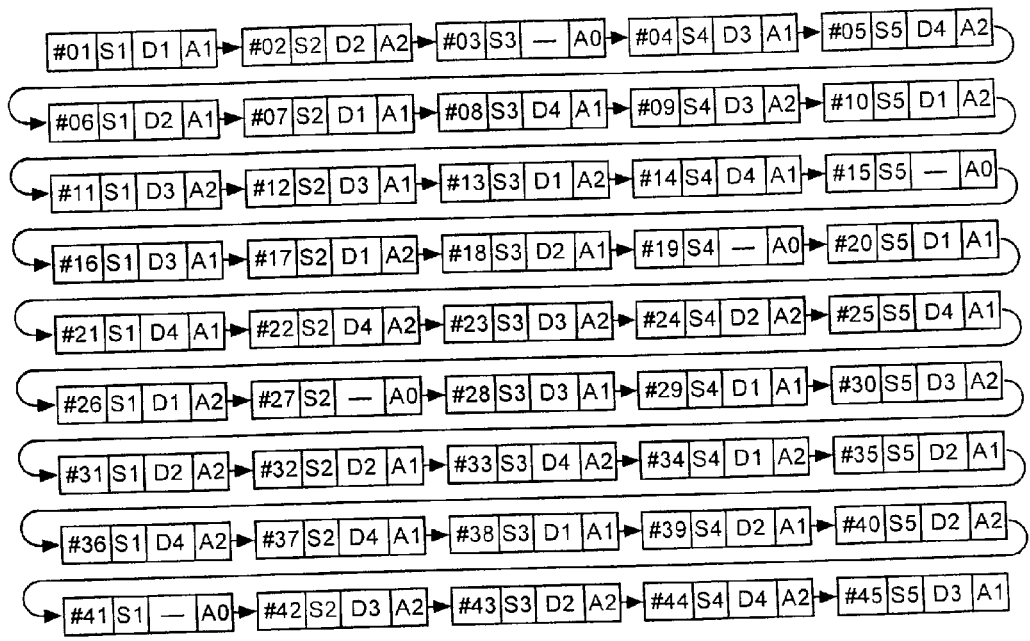
FIG. 6 shows an example of the temporal sequence of diffusion-encoding events for an acquisition according to the first aspect of the invention.

In accordance with the invention, the acquisition order of the 45 encoding/slice combinations in the example of FIG. 3 is reordered in one of many possible ways to give the non-limiting example of FIG. 6. In the first slice block (row), a different combination of D and A values is used for each slice, including one slice that has no diffusion encoding, thus breaking the rhythm of the repetitive pattern in FIG. 3. A properly selected variation in the values of D and A creates an irregular pattern of currents in the X, Y, and Z gradient coils, which in turn creates a series of mechanical jolts having varying characteristics, reducing the tendency to establish a rhythmic motion in the patient. Vibration is further suppressed by the judicious scattering of the NS reference images, with no diffusion-encoding gradients, in this Reordered List.

Since there is no correlation between the desired number of slices NS and the desired number of combinations of diffusion-encoding orientation and sensitivity NC, the block of slices in the Reordered List may contain more slice positions NS than said combinations NC, in which case the slice block will contain slices having different slice positions but sharing the same combination of diffusion-encoding orientation and sensitivity. In this case, and to the extent possible, the invention avoids acquiring temporally consecutive slices with the same combination of diffusion-encoding orientation and sensitivity. On the other hand, the desired number of slices NS might be less than NC, and some of the distinct desired combination of diffusion-encoding orientation and sensitivity will not be used within one particular slice block. If it is desired that certain encoding/slice combinations be deleted or added to the typical list of NS×ND×NA+NS elements, it may be necessary to add additional scans to maintain the fixed, repeating S1, S2, S3, . . . $S_{NS}$ slice order.

This first aspect of the invention disrupts the rhythmic jolting of the apparatus by scrambling the ordinary order of the desired D and A values, rather than creating equivalent diffusion-encoding gradient pulse multiplets, that is, modified pulse multiplets having the same diffusion characteristics but different mechanical characteristics, as described by Maier (U.S. Pat. No. 7,239,140).

A scattered arrangement of the unencoded reference images is particularly helpful for breaking the rhythmic pattern of the mechanical motion of the apparatus because these acquisitions lack the strong diffusion-encoding gradient pulses used for the diffusion-encoded images. The first aspect of the invention scrambles the diffusion encoding by avoiding the strict, nested-loop structure shown in FIG. 3. This, in turn, allows additional images to be added to the Reordered List freely, subject only to the requirement that slices be excited in a strictly repeating order:

S1, S2, S3, . . . $S_{NS}$, S1, S2, S3, . . . $S_{NS}$, . . .

In a second aspect of the invention, the usual NS unencoded images are supplemented with the acquisition of an additional NS unencoded images, one for each slice position in the slice block. The temporal positions of these additional acquisitions are scattered throughout the acquisition of the entire set of NES images, either randomly or in a specific pattern that further minimizes vibration. This concept can be expanded by adding as many additional unencoded images as desired, NS at a time, dispersing them throughout the acquisition of the entire set of NES images, further disrupting the pattern of mechanical jolts at the cost of a modest increase in the total imaging time.

Figure 7A:
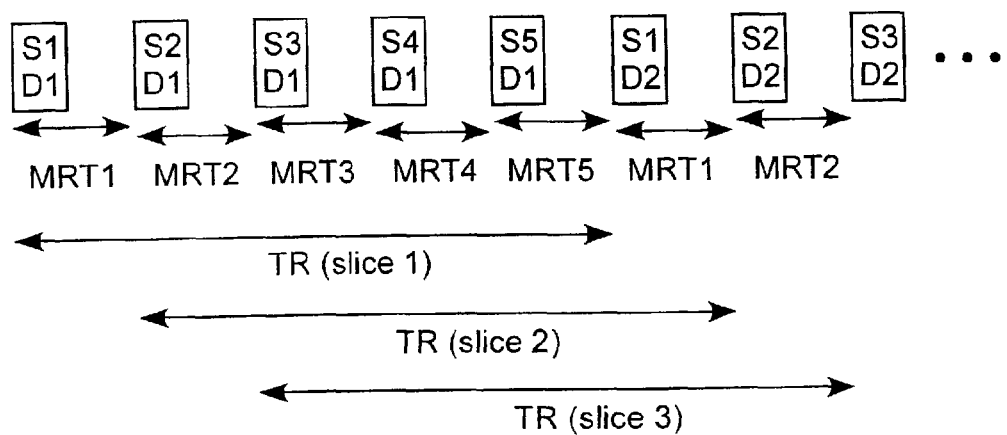
FIG. 7A shows a portion of the acquisition timing for five representative slices in a diffusion-encoding sequence of conventional design.
Figure 7B:
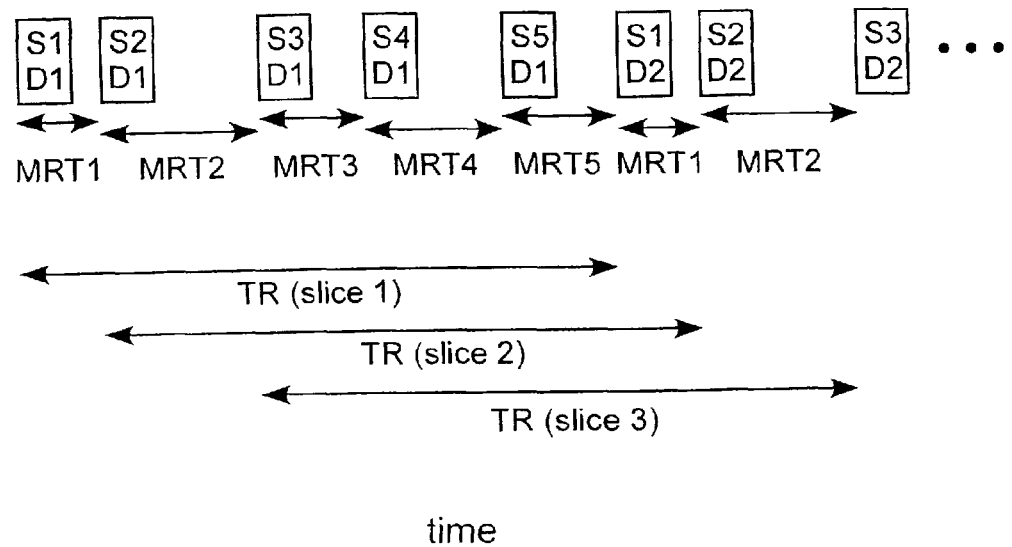
FIG. 7B shows an example of the irregular pulse timing of the same slices and diffusion directions in accordance with the invention.

In single-shot pulse sequences of ordinary design, the time needed to acquire each single image is constant, and the most rapid multi-slice acquisition allows no waiting time between the acquisition of one slice and the next. This naturally leads to repetitive mechanical jolting. If TR is increased, some waiting time is added to the slice block, and this is ordinarily divided equally among the NS slices, again leading to repetitive mechanical jolting as shown for the five example slices in FIG. 7A. In this example, the time required for the acquisition of a slice is shown by the width of the rectangle, the waiting time is shown by the space between rectangles, the slice position is indicated by S, the diffusion encoding direction is indicated by D, and amplitudes are omitted. All of the values of the MRT are equal. TR is the time from the excitation of a particular slice to the next excitation of the same slice, and all of the TR values are the same, a requirement for consistent image intensity. For this example, TR is five times the value of the MRT. In a third aspect of the invention, diffusion-encoding gradient pulses are applied in the order used by existing pulse sequences, but the ordinarily consistent period between the acquisitions of the slices is made inconsistent to disrupt the rhythmic jolting of the apparatus. FIG. 7B shows that it is possible to create unequal values of the MRT between slice acquisitions while still retaining the required consistency of TR for each slice. This requires the operator to select a value of TR larger than the minimal value. The invention divides this additional time into NS unequal portions in a fashion chosen to break the rhythm of the mechanical jolts. Inserting said time portions between the slice acquisitions yields NS mutually unequal values of the mechanical repetition time, for example, MRT1 through MRT5 in FIG. 7B. To maintain a constant value of TR for each slice, the same unequal MRT values in the same order must be repeated each time the block of NS slices is imaged with various values of the diffusion-encoding directions and amplitudes. Thus the mechanical jolts from the diffusion-encoding and other gradient pulses occur at unequal intervals, while the RF excitation of a particular slice location occurs repeatedly at intervals of TR. FIG. 7B shows a pseudo-random pattern of waiting times between slice acquisitions, but a monotonic increase or decrease of the MRT values over the slice block will also disrupt the rhythm of the jolts. Although the pattern of MRT values repeats each time the block of slices is imaged, this repetition typically occurs at a frequency lower than the important mechanical resonances of the MR imager.

In a fourth aspect of the invention, the reordering of the diffusion-encoding parameters A and D described in the first aspect of the invention is combined with the timing changes described in the third aspect of the invention to further reduce the vibration of the apparatus. Additional unencoded images may be acquired as described in the second aspect of the invention.

It is recognized that no combination of gradient amplitude rearrangements or timing changes will eliminate vibration of the patient table. It is the purpose of the invention to prevent the MR apparatus from attaining a vibrational steady state with high motion amplitudes. Rather than seeking an optimal reordering and timing pattern from the large number of possibilities, the invention assumes that a few selected non-rhythmic patterns will in most cases create less image artifact than the strongly rhythmic pattern of existing sequences. Because the complex vibrations of the patient table will change from one patient to the next, and from one set of sequence parameters, such as TR and the number of slices, to the next, the invention allows the operator to select from a small menu of gradient and timing patterns. These patterns may be estimated or computed, and are accepted or rejected on the basis of the vibration amplitude or image artifact in a short test measurement.

The starting point for selecting a suitable gradient reordering scheme is a fixed, repeating set of slice positions combined with a pseudorandom rearrangement of the desired combinations of diffusion-encoding orientation and sensitivity, as in FIG. 6. The algorithm then scans the list for temporally adjacent slices having the same values of D and A, and further rearranges the list to avoid this adjacency. Suitable timing patterns for the third aspect of the invention are similarly created from a pseudorandom pattern, rearranged to avoid having close MRT values for temporally adjacent slices. Other timing patterns are chosen to change the MRT values smoothly from, for example, a minimal value to a larger value, sweeping rapidly through any MRT value that might, if repeated, reinforce a mechanical resonance of the system. After the operator selects a diffusion encoding reordering scheme, or a scheme for varying the MRT values, or both, a short test acquisition is performed to confirm the suitability of the choice. The results of this test may be evaluated by manual review of the images, or, for images at the same slice position, by a computerized comparison of the nominally equivalent images. If the images show vibration artifact, the operator may choose a different set of reordering or timing patterns. A more automated embodiment of the invention employs a vibration sensor of ordinary design, but compatible with the static and time-varying magnetic fields of the MR imager, attached to the patient table. The amplitude of the sensor signal as the preliminary scans are performed gives immediate feedback to the scanner, and the most suitable of the preliminary scan patterns can be selected by straightforward computer algorithms without operator intervention.

Thus, a method for producing an image of an object located in the field of view of an MR imaging system, which image is sensitized to molecular diffusional motions within the object, includes the following steps.

(a) selecting combinations of diffusion-encoding gradient pulses of suitable amplitudes and orientations to sensitize the pulse sequence to diffusional motion in the desired directions;

(b) selecting the number of slices ("NS") to be acquired and their distinct spatial positions;

(c) creating one or more lists of the amplitudes and directions of the pulses in (a) and the slices in (b), making entries for each desired combination of slice position, diffusion-encoding direction, and diffusion-encoding amplitude, usually including an amplitude of zero for reference at each slice position, such that pulses of similar amplitude and direction are not adjacent, and selecting one of these lists for use;

(d) selecting the repetition time TR, and subtracting from this the minimum possible TR to compute the extra waiting time between the slice acquisitions;

(e) dividing the extra waiting time, if any, into NS unequal portions, and creating a list of these time portions;

(f) acquiring a rapid image at the first slice position, using the first combination of diffusion-sensitizing pulses from the list chosen in (c);

(g) waiting for a period of time determined by the first time value in the list (e);

(h) acquiring a rapid image at the next slice position, which does not overlap the first slice position, using the next combination of diffusion-encoding pulses from the list chosen in (c);

(i) waiting for a period of time determined by the next time value in the list (e);

(j) repeating steps (h) and (i) until one image has been acquired from each desired slice position;

(k) again acquiring a rapid image at the first slice position, using the next combination of diffusion-sensitizing pulses from the pulse list chosen in (c);

(l) waiting for a period of time determined by the first time value in the list (e);

(m) acquiring a rapid image at the next slice position, using the next combination of diffusion-encoding pulses from the list chosen in (c);

(n) waiting for a period of time determined by the next time value in the list (e);

(o) repeating steps (m) and (n), reacquiring slices in the same order as in (j), and using waiting periods after each acquisition from list (e), until all desired diffusion-sensitizing pulses from the list chosen in (c) have been used for every slice position selected in (b);

(p) evaluating either the vibration level of the patient table with a sensor, or evaluating the images manually or automatically for artifact;

(q) repeating steps (f) through (p), using a different one of the pulse lists created in step (c), and optionally a new uneven division of the waiting time (e), until satisfactory results are obtained.

Although the best estimation of the efficacy of the pulse reordering and timing disruption is made with full scans of every desired slice and every desired diffusion encoding, reasonable preliminary scans may be performed more rapidly by reducing the number of slices or the number of diffusion encodings. After examining the preliminary scans for artifacts, or after measuring the patient table vibration, a final imaging scan is performed with the full number of slices and diffusion encodings.

In a further embodiment of the invention, the operator may choose among the primary and secondary lists of gradient pulses (for the first embodiment) or among the primary and secondary timing lists (for the second embodiment), or both (for the third embodiment). The operator can acquire a full or partial scan to evaluate the vibration artifact manually, and select the best list or lists. If a partial scan was used to evaluate the vibration artifact, a final scan can be run with the preferred lists.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for producing an image of an object located in the field of view of a magnetic resonance (MR) imaging system, said image being sensitive to molecular diffusional motion in one or more spatial directions, and said image being substantially insensitive to mechanical vibration of the MR imaging, comprising the steps of:

(a) making a list of all the desired combinations of diffusion-encoding direction, diffusion-encoding amplitudes, and slice positions, said list including the desired unencoded reference acquisitions;

(b) transferring one element of list (a) associated with the first desired slice position to the first position of a primary reordered list, and then transferring another element of list (a) associated with the second desired slice position to second position of the reordered list, and continuing until one element is transferred for each of the spatially distinct desired slice positions of the slice block, these elements chosen to randomize or avoid repetitious patterns of the diffusion-encoding directions and amplitudes;

(c) transferring additional elements of list (a) to the reordered list, repeating the same slice order as in (b), and again seeking to avoid repetition patterns of the diffusion encoding, this process continuing until all of the elements of list (a) have been transferred to the reordered list;

(d) repeating steps (a) through (c) to create one or more distinct secondary reordered lists;

(e) beginning with the first element of the primary reordered list, acquiring single-shot images using the slice position, the diffusion-encoding direction and the diffusion-encoding amplitude contained in said element, and continuing, in order, through the elements of said list, acquiring one image for each element;

(f) reconstructing and displaying the images as in existing pulse sequences; and (g) reacquiring the scan, if needed, with one of the alternate pulse lists from step (d) if analysis of the resulting data shows unacceptable levels of patient table vibration or patient motion or vibration-induced image artifact.

2. The method of claim 1 comprising performing the analysis in step (g) by manual inspection of the images.

3. The method of claim 1 comprising performing the analysis in step (g) automatically based on the patient table vibration measured by a sensor.

4. The method of claim 1 comprising performing the analysis in step (g) automatically with examination of the image data.

5. The method of claim 1 comprising including additional unencoded reference acquisitions, having the same fixed number for each slice position, in the list in step (a) that disrupt the regular jolting of the gradient coil after said additional acquisitions are scattered throughout reordered list in step (b).

6. A method for producing an image of an object located in the field of view of a magnetic resonance (MR) imaging system, said image being sensitive to molecular diffusional motion in one or more spatial directions, and said image being substantially insensitive to mechanical vibration of the MR imaging, comprising the steps of:

(a) subtracting the minimum TR value from the user-selected TR value, and dividing this waiting time into random unequal time portions, one portion for each desired slice position, to form a timing list;

(b) adjusting said timing list to avoid similar adjacent time intervals while maintaining the same sum;

(c) repeating steps (a) and (b) to create one or more distinct secondary timing lists;

(d) using the first element of the timing list as a waiting time following the acquisition of the image from the first slice position;

(e) acquiring images at the remaining slice positions, each with the same diffusion encoding, using the following elements of the timing list in order as the waiting times following the acquisition of each slice;

(f) reacquiring a slice at the first slice position using the next direction or amplitude of diffusion-encoding, followed by a waiting time given by the first element on the timing list;

(g) continuing the acquisition of slices, each slice position being associated with a single element of the timing list, until all encoding/slice combinations have been acquired;

(h) reconstructing and displaying the images as in existing pulse sequences; and (i) reacquiring the scan, if needed, with one of the secondary timing lists from step (c) if analysis of the resulting data shows unacceptable levels of patient table vibration or patient motion or vibration-induced image artifact.

7. The method of claim 6 comprising performing the analysis in step (i) by manual inspection of the images.

8. The method of claim 6 comprising performing the analysis in step (i) automatically based on the patient table vibration measured by a sensor.

9. The method of claim 6 comprising performing the analysis in step (i) automatically with examination of the image data.

10. A method for producing an image of an object located in the field of view of a magnetic resonance (MR) imaging system, said image being sensitive to molecular diffusional motion in one or more spatial directions, and said image being substantially insensitive to mechanical vibration of the MR imaging, comprising the steps of:

(a) making a list of all the desired combinations of diffusion-encoding direction, diffusion-encoding amplitudes, and slice positions, said list to include the desired unencoded reference acquisitions;

(b) transferring one element of list (a) associated with the first desired slice position to the first position of a primary reordered list, and then transferring another element of list (a) associated with the second desired slice position to second position of the reordered list, and continuing until one element is transferred for each of the spatially distinct desired slice positions of the slice block, these elements chosen to randomize or avoid repetitious patterns of the diffusion-encoding directions and amplitudes;

(c) transferring additional elements of list (a) to the reordered list, repeating the same slice order as in (b), and again seeking to avoid repetition patterns of the diffusion encoding, this process continuing until all of the elements of list (a) have been transferred to the reordered list;

(d) repeating steps (a) through (c) to create one or more distinct secondary reordered lists;

(e) subtracting the minimum TR value from the user-selected TR value, and dividing this waiting time into random unequal time portions, one portion for each desired slice position, to form a timing list;

(f) adjusting this timing list to avoid similar adjacent time intervals while maintaining the same sum;

(g) repeating steps (h) and (i) to create one or more distinct secondary timing lists;

(h) using the first element of the primary reordered list (b) as the diffusion-encoding direction and strength for the acquisition of the image from the first slice position;

(i) using the first element of the timing list as a waiting time following the acquisition of the image from the first slice position;

(j) acquiring one image at each of the remaining distinct slice positions, each with a different diffusion-encoding direction and strength determined by succeeding elements in the primary reordered list (b), and following each acquisition with a waiting period determined by sequential elements of the timing list;

(k) reacquiring a slice at the first slice position using the diffusion encoding of the next element in the primary reordered list (b);

(l) following this slice by a waiting time given by the first element on the timing list, that is, recycling the list;

(m) continuing the acquisition of slices in the same spatial order, selecting the diffusion-encoding for each from the primary reordered list (b), and following each acquisition with a waiting time from the next element in the timing list, recycling said timing list as needed, until all encoding/slice combinations have been acquired;

(n) reconstructing and displaying the images as in existing pulse sequences; and (o) reacquiring the scan, if needed, with one of the secondary pulse lists from step (c) and/or one of the secondary timing list s from step (f) if analysis of the resulting data shows unacceptable levels of patient table vibration or patient motion or vibration-induced image artifact.

11. The method of claim 10 comprising performing the analysis in step (o) by manual inspection of the images.

12. The method of claim 10 comprising performing the analysis in step (o) automatically based on the patient table vibration measured by a sensor.

13. The method of claim 10 comprising performing the analysis in step (o) automatically with examination of the image data.

14. A magnetic resonance apparatus for producing an image of an object, said image being sensitive to molecular diffusional motion in one or more spatial directions, and said image being relatively insensitive to mechanical vibration of the MR imaging, comprising:

a magnetic resonance data acquisition unit configured to receive an object therein to be imaged;

a control unit that operates said data acquisition unit; and said control unit being configured to (a) make a list of all the desired combinations of diffusion-encoding direction, diffusion-encoding amplitudes, and slice positions, said list including the desired unencoded reference acquisitions, (b) transfer one element of list (a) associated with the first desired slice position to the first position of a primary reordered list, and then transferring another element of list (a) associated with the second desired slice position to second position of the reordered list, and continuing until one element is transferred for each of the spatially distinct desired slice positions of the slice block, these elements chosen to randomize or avoid repetitious patterns of the diffusion-encoding directions and amplitudes, (c) transfer additional elements of list (a) to the reordered list, repeating the same slice order as in (b), and again seeking to avoid repetition patterns of the diffusion encoding, this process continuing until all of the elements of list (a) have been transferred to the reordered list, (d) repeat steps (a) through (c) to create one or more distinct secondary reordered lists, (e) begin with the first element of the primary reordered list, acquiring single-shot images using the slice position, the diffusion-encoding direction and the diffusion-encoding amplitude contained in said element, and continuing, in order, through the elements of said list, acquiring one image for each element, (f) reconstruct and display the images as in existing pulse sequences, and (g) reacquire the scan, if needed, with one of the alternate pulse lists from step (d) if analysis of the resulting data shows unacceptable levels of patient table vibration or patient motion or vibration-induced image artifact.

15. An apparatus for producing an image of an object, said image being sensitive to molecular diffusional motion in one or more spatial directions, and said image being relatively insensitive to mechanical vibration of the MR imaging, comprising:

a magnetic resonance data acquisition unit configured to receive an object therein to be imaged;

a control unit that operates said data acquisition unit; and said control unit being configured to (a) subtract the minimum TR value from the user-selected TR value, and dividing this waiting time into random unequal time portions, one portion for each desired slice position, to form a timing list, (b) adjust said timing list to avoid similar adjacent time intervals while maintain the same sum, (c) repeat steps (a) and (b) to create one or more distinct secondary timing lists, (d) use the first element of the timing list as a waiting time following the acquisition of the image from the first slice position, (e) acquire images at the remaining slice positions, each with the same diffusion encoding, using the following elements of the timing list in order as the waiting times following the acquisition of each slice, (f) reacquire a slice at the first slice position using the next direction or amplitude of diffusion-encoding, followed by a waiting time given by the first element on the timing list, (g) continue the acquisition of slices, each slice position being associated with a single element of the timing list, until all encoding/slice combinations have been acquired, (h) reconstruct and display the images as in existing pulse sequences, and (i) reacquire the scan, if needed, with one of the secondary timing lists from step (c) if analysis of the resulting data shows unacceptable levels of patient table vibration or patient motion or vibration-induced image artifact.

16. An apparatus for producing an image of an object located in the field of view of a magnetic resonance (MR) imaging system, said image being sensitive to molecular diffusional motion in one or more spatial directions, and which image is relatively insensitive to mechanical vibration of the MR imaging, comprising the steps of:

a magnetic resonance data acquisition unit configured to receive an object therein to be imaged;

a control unit that operates said data acquisition unit; and said control unit being configured to (a) make a list of all the desired combinations of diffusion-encoding direction, diffusion-encoding amplitudes, and slice positions, said list to include the desired unencoded reference acquisitions, (b) transfer one element of list (a) associated with the first desired slice position to the first position of a primary reordered list, and then transferring another element of list (a) associated with the second desired slice position to second position of the reordered list, and continuing until one element is transferred for each of the spatially distinct desired slice positions of the slice block, these elements chosen to randomize or avoid repetitious patterns of the diffusion-encoding directions and amplitudes, (c) transfer additional elements of list (a) to the reordered list, repeating the same slice order as in (b), and again seeking to avoid repetition patterns of the diffusion encoding, this process continuing until all of the elements of list (a) have been transferred to the reordered list, (d) repeat steps (a) through (c) to create one or more distinct secondary reordered lists, (e) subtracting the minimum TR value from the user-selected TR value, and dividing this waiting time into random unequal time portions, one portion for each desired slice position, to form a timing list, (f) adjusting this timing list to avoid similar adjacent time intervals while maintain the same sum, (g) repeat steps (h) and (i) to create one or more distinct secondary timing lists, (h) use the first element of the primary reordered list (b) as the diffusion-encoding direction and strength for the acquisition of the image from the first slice position, (i) use the first element of the timing list as a waiting time following the acquisition of the image from the first slice position, (j) acquire one image at each of the remaining distinct slice positions, each with a different diffusion-encoding direction and strength determined by succeeding elements in the primary reordered list (b), and following each acquisition with a waiting period determined by sequential elements of the timing list, (k) reacquire a slice at the first slice position using the diffusion encoding of the next element in the primary reordered list (b), (l) follow this slice by a waiting time given by the first element on the timing list, that is, recycling the list, (m) continue the acquisition of slices in the same spatial order, selecting the diffusion-encoding for each from the primary reordered list (b), and following each acquisition with a waiting time from the next element in the timing list, recycling said timing list as needed, until all encoding/slice combinations have been acquired, (n) reconstruct and display the images as in existing pulse sequences, and (o) reacquire the scan, if needed, with one of the secondary pulse lists from step (c) and/or one of the secondary timing lists from step (f) if analysis of the resulting data shows unacceptable levels of patient table vibration or patient motion or vibration-induced image artifact.

* * * * *